United States Patent
Yamashita et al.

(10) Patent No.: US 10,209,566 B2
(45) Date of Patent: Feb. 19, 2019

(54) LIGHT-EMITTING DEVICE

(71) Applicant: NICHIA CORPORATION, Anan-shi, Tokushima (JP)

(72) Inventors: Ryohei Yamashita, Tokushima (JP); Shimpei Sasaoka, Itano-gun (JP); Toshiyuki Hashimoto, Anan (JP)

(73) Assignee: NICHIA CORPORATION, Anan-Shi (JP)

(*) Notice: Subject to any disclaimer, the term of this patent is extended or adjusted under 35 U.S.C. 154(b) by 0 days.

(21) Appl. No.: 15/986,738

(22) Filed: May 22, 2018

(65) Prior Publication Data

US 2018/0341152 A1 Nov. 29, 2018

(30) Foreign Application Priority Data

May 24, 2017 (JP) .................. 2017-102972

(51) Int. Cl.
G02F 1/1335 (2006.01)
H01L 33/50 (2010.01)
(Continued)

(52) U.S. Cl.
CPC .. *G02F 1/133611* (2013.01); *G02F 1/133603* (2013.01); *G02F 1/133605* (2013.01); *G02F 1/133606* (2013.01); *H01L 25/0753* (2013.01); *H01L 33/502* (2013.01); *H01L 33/60* (2013.01); *H01L 33/62* (2013.01); *G02F 2001/133607* (2013.01)

(58) Field of Classification Search
CPC ......... G02F 1/133611; G02F 1/133606; G02F 1/133605; G02F 1/133603; G02F 2001/133607; G02F 2201/133557; H01L 25/0753; H01L 33/62; H01L 33/60; H01L 33/502; G02B 6/003

See application file for complete search history.

(56) References Cited

U.S. PATENT DOCUMENTS 7,441,929 B2 * 10/2008 Stefanov ................... F21K 9/00
                                                         362/336
2004/0084681 A1 * 5/2004 Roberts ................ B60Q 1/2665
                                                         257/79

(Continued)

FOREIGN PATENT DOCUMENTS

JP  2010-032894 A  2/2010
JP  2012-094266 A  5/2012

(Continued)

*Primary Examiner* — Joseph L Williams
*Assistant Examiner* — Jose M Diaz
(74) *Attorney, Agent, or Firm* — Foley & Lardner LLP

(57) ABSTRACT

A light-emitting device includes: a base having an upper surface; a plurality of light sources located on the upper surface of the base; a first lenticular lens sheet disposed to face the base with the light sources between the first lenticular lens sheet and the base, the first lenticular lens sheet including a first plurality of grooves; a half mirror located on an upper surface side of the first lenticular lens sheet; and a second lenticular lens sheet disposed on an upper surface side of the half mirror, wherein the second lenticular lens sheet includes a second plurality of grooves extending in a direction that intersects a direction in which the first plurality of grooves of the first lenticular lens sheet extend.

10 Claims, 7 Drawing Sheets

(51) Int. Cl.
　　　*H01L 33/60*　　　(2010.01)
　　　*H01L 33/62*　　　(2010.01)
　　　*H01L 25/075*　　(2006.01)

(56) References Cited

U.S. PATENT DOCUMENTS

| | | | |
|---|---|---|---|
| 2005/0201109 A1* | 9/2005 | Shimura | F21V 5/007 |
| | | | 362/382 |
| 2010/0214491 A1 | 8/2010 | Kuromizu et al. | |
| 2011/0222280 A1* | 9/2011 | Kim | H01L 33/58 |
| | | | 362/235 |
| 2013/0300285 A1 | 11/2013 | Ito | |
| 2015/0198749 A1* | 7/2015 | Ye | G02B 5/18 |
| | | | 359/581 |
| 2016/0265741 A1 | 9/2016 | Yamada et al. | |
| 2016/0320001 A1* | 11/2016 | Soer | F21V 9/08 |

FOREIGN PATENT DOCUMENTS

| | | |
|---|---|---|
| JP | 2016-171227 A | 9/2016 |
| WO | WO-2008/142877 A1 | 11/2008 |
| WO | WO-2012/099145 A1 | 7/2012 |

\* cited by examiner

LIGHT-EMITTING DEVICE

CROSS-REFERENCE TO RELATED APPLICATION

This application claims priority to Japanese Patent Application No. 2017-102972, filed on May 24, 2017, the disclosure of which is hereby incorporated by reference in its entirety.

BACKGROUND

The present application relates to a light-emitting device.

In recent years, direct-type surface light-emitting devices using semiconductor light-emitting elements have been proposed for backlight devices for use in display devices such as liquid crystal display devices. In view of function, design, etc., display devices are in some cases desired to be thin, and backlight devices are desired to be thinner. Light-emitting devices for general-purpose lighting applications are also desired to be thin in view of function, design, etc.

With reduction in thickness of light-emitting devices in such applications, unevenness in brightness across the light-emitting surface is generally likely to occur. WO 2012/099145 discloses a technique for reducing unevenness in brightness of a surface light-emitting device, in which a diffusive member is arranged on a portion of a surface of a resin body that seal a light source so as to enhance the uniformity of light emitted from the light source.

SUMMARY

In WO2012/099145, a diffusive member needs to be arranged for each light source. In view of this, the present disclosure provides a light-emitting device in which unevenness in brightness can be reduced using a simple configuration.

According to one embodiment, a light-emitting device includes: a base having an upper surface; a plurality of light sources arranged on the upper surface of the base; a first lenticular lens sheet disposed to face the base with the light sources therebetween; a half mirror located on an upper surface side of the first lenticular lens sheet; and a second lenticular lens sheet disposed on an upper surface side of the half mirror. The second lenticular lens sheet has a plurality of grooves extending in a direction that intersects a direction in which a plurality of grooves of the first lenticular lens sheet extend.

In the light-emitting device of the present disclosure, a half mirror disposed between two lenticular lens sheets allows for reducing unevenness in brightness.

DETAILED DESCRIPTION

Embodiments of a light-emitting device according to the present disclosure are described below with reference to the drawings. The light-emitting devices described below are examples, and various modifications can be made to the light-emitting devices described below. In the following description, the same or like members are denoted by the same designations or numerals, and the detailed description thereof may be omitted. A plurality of structural elements may be configured as a single member so that the single member serves the purpose of the plurality of elements, or a single structural element may be configured as a plurality of members which serve the purpose of a single element.

A light-emitting device according to one embodiment includes a light-transmissive layered structure including two lenticular lens sheets and a half mirror arranged therebetween, in which light emitted from a light source passes through the light-transmissive layered structure, which allows for reducing unevenness in brightness even if a distance (i.e., space) between the light source and the light-transmissive layered structure is small.

Figure 1:
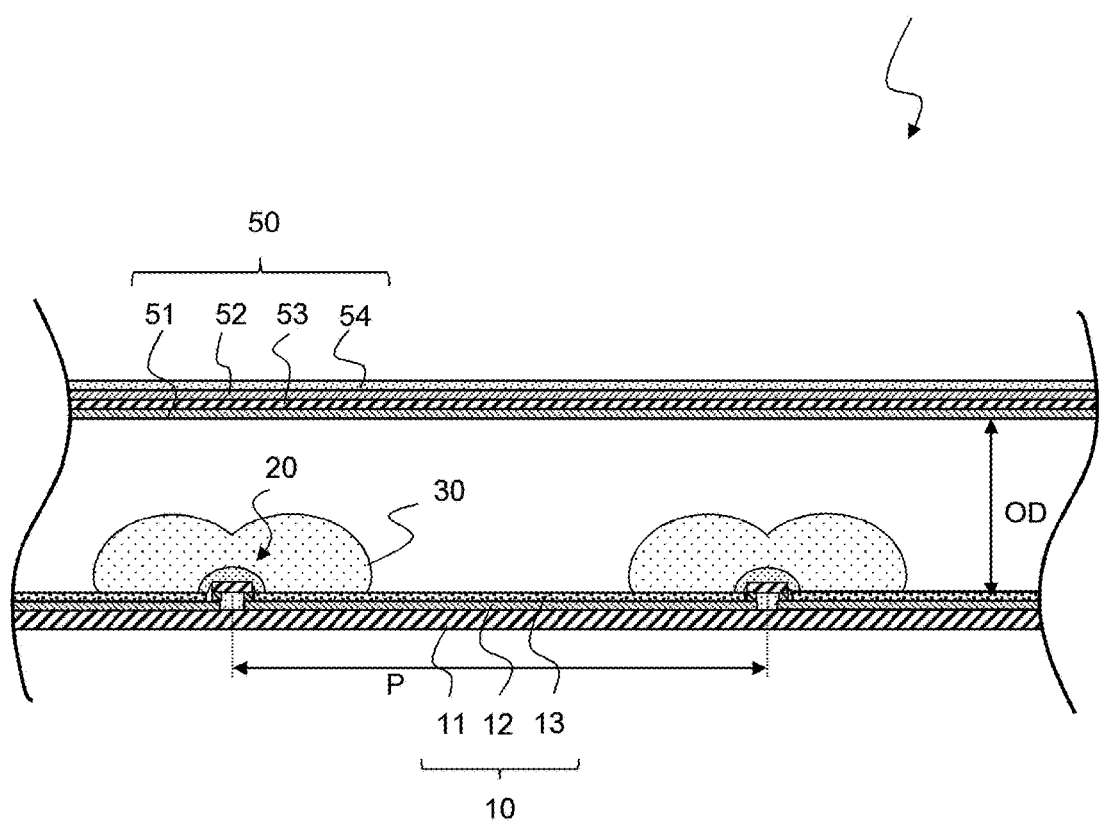
FIG. 1 is a schematic cross-sectional view showing a light-emitting device according to one embodiment of the present disclosure.

FIG. 1 is a schematic cross-sectional view of an example of a light-emitting device 100 according to one embodiment. The light-emitting device 100 includes a base 10, a plurality of light sources 20, a first lenticular lens sheet 51, a second lenticular lens sheet 52, and a half mirror 53. Each element will now be described in detail.

Base 10

The base 10 has an upper surface, and supports a plurality of light sources 20 thereon. The base 10 also supplies electric power to the light sources 20. The base 10 includes a substrate 11 and a conductive layer 12, for example. The base 10 may further include an insulating layer 13.

The substrate 11 is made of, for example, a resin, such as phenol resin, epoxy resin, polyimide resin, BT resin, polyphthalamide (PPA) or polyethylene terephthalate (PET), a ceramic, or the like. In view of low cost and moldability, it is preferable to select an insulating resin. Alternatively, a ceramic may be selected as a material of the substrate 11 so as to realize a light-emitting device having good heat resistance and light resistance. Examples of a ceramic include, alumina, mullite, forsterite, glass ceramic, nitride-based (e.g., AlN), carbide-based (e.g., SiC), etc. Among these, it is preferable to use a ceramic made of alumina or a ceramic whose main component is alumina.

In the case in which a resin is used as the material of the substrate 11, the resin can be mixed with an inorganic filler, such as glass fiber, $SiO_2$, $TiO_2$ or $Al_2O_3$, so as to improve the mechanical strength, reduce the coefficient of thermal expansion, and improve the optical reflectivity. The substrate 11 may alternatively be a composite plate including a metal plate and an insulating layer formed on the metal plate.

The conductive layer 12 has a predetermined wiring pattern. The conductive layer 12 is electrically connected to electrodes of the light source 20, and supplies electric power from outside to the light source 20. The wiring pattern includes a positive electrode wiring that is connected to the positive electrode of the light source 20, and a negative electrode wiring that is connected to the negative electrode of the light source 20. The conductive layer 12 is formed at least on the upper surface of the substrate 11, which serves as the surface on which the light source 20 is placed. A material of the conductive layer 12 can be selected appropriately from among conductive materials in accordance with the material of the substrate 11, the method for manufacturing the substrate 11, etc. For example, in the case in which a ceramic is used as the material of the substrate 11, the material of the conductive layer 12 is preferably a material having such a high melting point that the material can withstand the sintering temperature of a ceramic sheet, and it is preferably a high-melting-point metal such as tungsten or molybdenum, for example. A layer of another metal material, such as nickel, gold or silver, may be further disposed, by plating, sputtering, or vapor deposition, on the wiring pattern made of a high-melting-point metal as described above.

When a resin is used as a material of the substrate 11, a material of the conductive layer 12 is preferably a material that is easy to process. In the case in which an injection-molded resin is used, a material of the conductive layer 12 is preferably a material that can be easily processed in a process such as a stamping process, an etching process, or a bending process, and that has a relatively high mechanical strength. More specifically, it is preferable that the conductive layer 12 is a metal layer, lead flame, or the like, made of a metal such as copper, aluminum, gold, silver, tungsten, iron, nickel, iron-nickel alloy, phosphor bronze, iron-containing copper, molybdenum, etc. On a surface of the wiring pattern made of a metal as mentioned above, the conductive layer 12 may further include a layer of another metal material. For the layer of another material, any appropriate material may be used, and for example, a layer of silver, a layer of an alloy of silver and copper, gold, aluminum, rhodium, or the like, or a multi-layer using silver and an alloy may be used. The layer of another metal material may be formed by plating, sputtering, vapor deposition, or the like.

Insulating Layer 13

The base 10 may include the insulating layer 13. In the base 10, the insulating layer 13 is disposed over the substrate 11 to cover portions of the conductive layer 12 to which the light source 20, and the like, are connected. That is, the insulating layer 13 is electrically insulating and covers at least portions of the conductive layer 12. It is preferable that the insulating layer 13 is light-reflective. With the insulating layer 13 being light-reflective, light emitted from the light source 20 toward the base 10 can be reflected, which allows for improving the light extraction efficiency. With the insulating layer 13 being light-reflective, a portion of light emitted from the light source that is reflected by the light-transmissive layered structure can also be reflected by the insulating layer 13, which allows for improving the light extraction efficiency. These lights reflected by the base also passes through the light-transmissive layered structure, so that unevenness in brightness can be reduced.

Any appropriate material may be used for the insulating layer 13 as long as it does not substantially absorb light emitted from the light source 20 and is insulating. For example, a resin material such as an epoxy resin, a silicone resin, a modified silicone resin, an urethane resin, an oxetane resin, an acrylic resin, a polycarbonate resin or a polyimide resin may be used. In order to give optical reflectivity to the insulating layer 13, the resin material of the insulating layer 13 described above can be mixed with a white-color filler that is to be added to an underfill material as will be described below. The white-color filler will be described below in detail.

Light Source 20

In the present disclosure, the term "light source" refers to a part that emits light. For the light source, a light-emitting element, a structure including a light-emitting element combined with a wavelength conversion member, a package product including a light-emitting element therein, e.g., an SMD light-emitting device, an element called a "package-type white LED," or the like may be employed, and the light source may have any appropriate shape and structure.

Figure 2A:
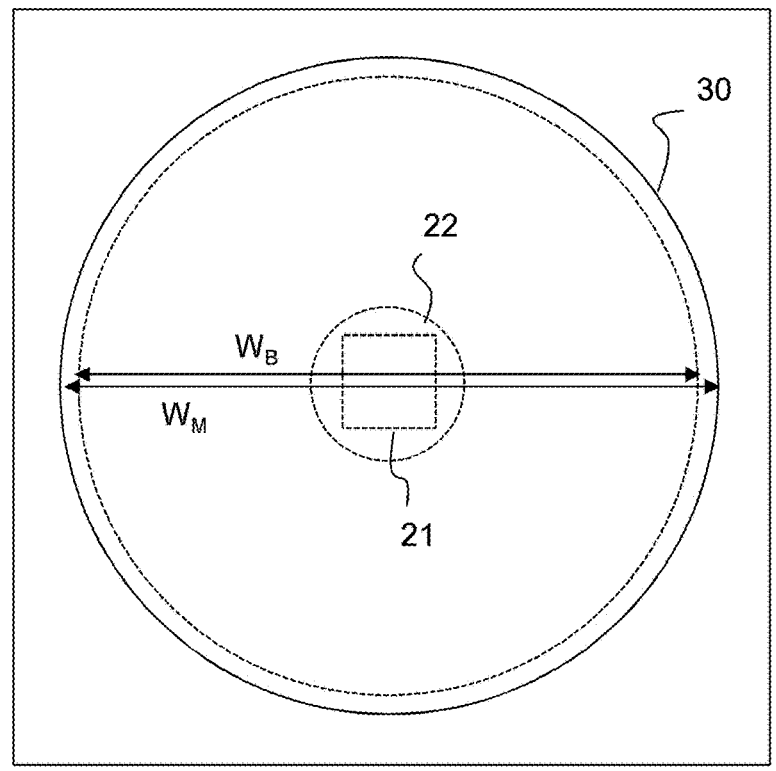
FIG. 2A is a schematic plan view showing, on an enlarged scale, a light source and its vicinity of the light-emitting device shown in FIG. 1.
Figure 2B:
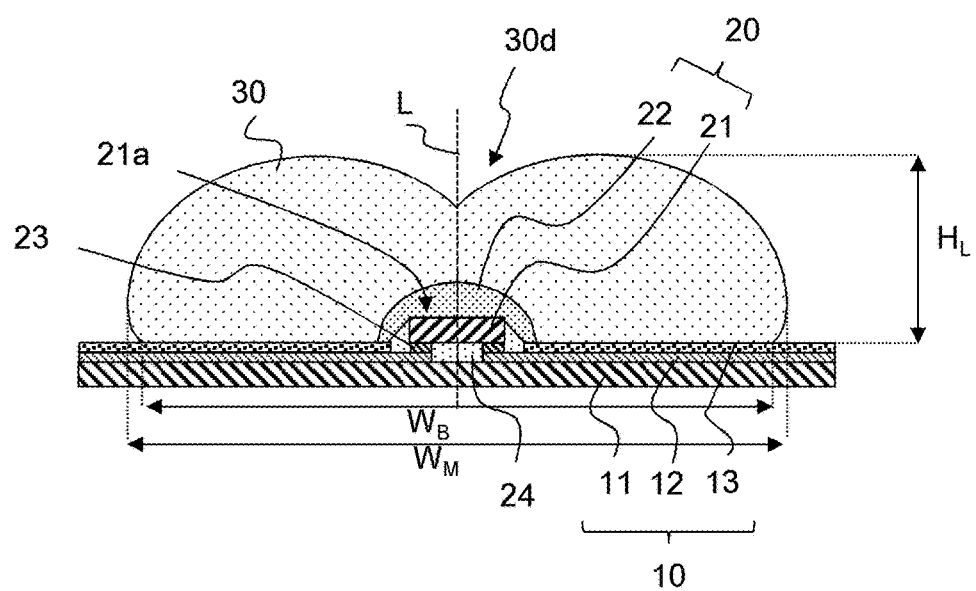
FIG. 2B is a schematic cross-sectional view showing, on an enlarged scale, the light source and its vicinity of the light-emitting device and shown in FIG. 1.

FIG. 2A and FIG. 2B are a plan view and a cross-sectional view, respectively, showing, on an enlarged scale, the light source 20 and its vicinity of the light-emitting device 100 of the present embodiment. The light source 20 includes a light-emitting element 21. In the present embodiment, the light source 20 further includes a wavelength conversion member 22. A plurality of light sources 20 are arranged in a one-dimensional pattern or a two-dimensional pattern on the base 10.

The light-emitting element 21 is a light-emitting diode in the present embodiment. Any wavelength may be selected as the wavelength of light emitted from the light-emitting element 21. Examples of a blue light-emitting element and a green light-emitting element include a light-emitting element using a nitride-based semiconductor ($In_xAl_yGa_{1-x-y}N$, $0 \leq X$, $0 \leq Y$, $X+Y \leq 1$) or a semiconductor such as ZnSe and GaP. Examples of a red light-emitting element include a light-emitting element using a semiconductor such as GaAlAs and AlInGaP. Alternatively, a semiconductor light-emitting element made of a material other than those described above may be used. The composition, the emission color, the size, the number, etc., of light-emitting elements used may be selected appropriately in accordance with the purpose.

In the case in which the light source 20 includes the light-emitting element 21 and the wavelength conversion member 22, the light-emitting element 21 preferably uses a nitride semiconductor ($In_xAl_yGa_{1-x-y}N$, $0 \leq X$, $0 \leq Y$, $X+Y \leq 1$)

configured to emit light of a short wavelength that can efficiently excite the wavelength conversion material contained in the wavelength conversion member 22. Various emission wavelengths can be selected in accordance with a material and a ratio of the mixed crystals of the semiconductor layer. The light-emitting element 21 may include the positive electrode and the negative electrode on the same side or on opposite sides of the light-emitting element 21.

The light-emitting element 21 includes, for example, a growth substrate and semiconductor layers layered on the growth substrate. The semiconductor layers includes an n-type semiconductor layer, a p-type semiconductor layer, and an active layer disposed therebetween. The negative electrode and the positive electrode are electrically connected to the n-type semiconductor layer and the p-type semiconductor layer, respectively. For the growth substrate, for example, a light-transmissive sapphire substrate, or the like may be used.

An n-side electrode and a p-side electrode of the light-emitting element 21 are flip-chip mounted on the base 10 via a connection member 23, as shown in FIG. 2B. The light-emitting element 21 is configured to emit light mainly from a surface thereof that is opposite to a surface thereof on which the n-side electrode and the p-side electrode are formed, i.e., from an upper surface 21a of the light-emitting element 21, which is a principle surface of the light-transmissive sapphire substrate. More specifically, the positive electrode and the negative electrode of the light-emitting element 21 are connected, via the connection member 23, to the positive electrode wiring and the negative electrode wiring, respectively, included in the conductive layer 12 of the base 10.

Connection Member 23

The connection member 23 is formed from a conductive material. Specifically, examples of the material of the connection member 23 include Au-containing alloy, Ag-containing alloy, Pd-containing alloy, In-containing alloy, Pb—Pd-containing alloy, Au—Ga-containing alloy, Au—Sn-containing alloy, Sn-containing alloy, Sn—Cu-containing alloy, Sn—Cu—Ag-containing alloy, Au—Ge-containing alloy, Au—Si-containing alloy, Al-containing alloy, Cu—In-containing alloy, and a mixture of a metal and a flux.

For the connection member 23, a material in the form of a liquid, a paste or a solid (e.g., a sheet form, a block form, a powder form, or a wire form) can be used, and any appropriate material can be selected in accordance with the composition, the shape of the supporting body, etc. For the connection member 23, a single member may be used, or a plurality of kinds of members may be used in combination.

Underfill Member 24

As shown in FIG. 2B, an underfill member 24 is preferably arranged between the light-emitting element 21 and the base 10. The underfill member 24 contains a filler for the purpose of, for example, allowing for efficiently reflecting light from the light-emitting element 21 and having the coefficient of thermal expansion closer to that of the light-emitting element 21. The underfill member 24 may also cover lateral surfaces of the light-emitting element 21, as shown in FIG. 2B, or may not cover the lateral surfaces of the light-emitting element 21.

The underfill member 24 includes, as a matrix, a material that does not substantially absorb light from the light-emitting element. For example, a material such as epoxy, silicone, modified silicone, urethane resin, oxetane resin, acrylic, polycarbonate or polyimide may be used for the underfill member 24.

With the underfill member 24 containing a white filler, light can more easily be reflected, and it is possible to improve the light extraction efficiency. The filler is preferably an inorganic compound. The expression "white filler," as used herein, includes a filler appearing white due to scattering in the case in which a refractive index of the filler and a refractive index of a material around the filler are different, even if the filler itself is transparent.

The reflectance of the filler is preferably 50% or more, and more preferably 70% or more, with respect to light of the emission wavelength of the light-emitting element 21. Then, it is possible to improve the light extraction efficiency of the light-emitting device 100. The particle size of the filler is preferably 1 nm or more and 10 μm or less. The particle size of the filler in such a range allows for improving the resin fluidity as the underfill material, so that even small gaps can be filled well with the material to be the underfill member 24. The particle size of the filler is preferably 100 nm or more and 5 μm or less, and more preferably 200 nm or more and 2 μm or less. The shape of the filler may be spherical or scale-shaped.

More specifically, examples of the filler material include an oxide such as $SiO_2$, $Al_2O_3$, $Al(OH)_3$, $MgCO_3$, $TiO_2$, $ZrO_2$, ZnO, $Nb_2O_5$, MgO, $Mg(OH)_2$, SrO, $In_2O_3$, $TaO_2$, HfO, SeO or $Y_2O_3$, a nitride such as SiN, AN or AlON, a fluoride such as $MgF_2$, etc. These materials may be used singly or in combination.

Wavelength Conversion Member 22

The wavelength conversion member 22 absorbs at least a portion of light emitted from the light-emitting element 21, coverts it into light of a different wavelength, and radiate the converted light. The wavelength conversion member 22 covers at least the upper surface 21a of the light-emitting element 21. In the present embodiment, the wavelength conversion member 22 also covers the underfill member 24 disposed on the lateral surfaces of the light-emitting element 21. For example, the wavelength conversion member 22 contains cerium-activated yttrium-aluminum-garnet (YAG)-based phosphor, cerium-activated lutetium-aluminum-garnet (LAG), europium and/or chromium-activated nitrogen-containing calcium aluminosilicate ($CaO$—$Al_2O_3$—$SiO_2$)-based phosphor, europium-activated silicate ($(Sr,Ba)_2SiO_4$)-based phosphor, β sialon phosphor, a nitride-based phosphor such as CASN-based or SCASN-based phosphor, KSF-based phosphor ($K_2SiF_6$:Mn), sulfide-based phosphor, or the like. Phosphors other than those described above with similar performance, function and effect may be used.

The wavelength conversion member 22 may contain a light-emitting substance called nano-crystal or quantum dot, for example. For such a light-emitting substance, a semiconductor material such as II-VI group, III-V group, or IV-VI group semiconductors, more specifically, nano-size high-dispersion particles such as CdSe, core shell-type $CdS_xSe_{1-x}$/ZnS, or GaP can be used, for example.

A height of the wavelength conversion member 22 along an optical axis L of the light source 20 is preferably ⅘ or less of the maximum width of a cover member 30 to be described below. This allows the lens effect of the cover member 30 to be exhibited effectively.

Cover Member 30

The cover member 30 protects the light source 20 from the external environment, and optically controls the light distribution characteristic of light that is output from the light source 20. That is, mainly refraction of light through the outer surface of the cover member 30 allows for adjusting the direction of light emission. The cover member 30 is arranged on the base 10 to cover the light source 20.

The material of the cover member 30 may be a light-transmissive resin such as epoxy resin, silicone resin or a mixed resin thereof, or a glass. Among these, it is preferable to select silicone resin in view of light resistance and ease of molding.

The cover member 30 may contain a wavelength conversion material and a diffusing agent for diffusing light from the light source 20. The cover member 30 may also include a colorant in accordance with the color of emission of the light-emitting element. The wavelength conversion material, the diffusing agent, the colorant, etc., are preferably included in the cover member 30 in such amounts that the light distribution can be controlled by means of the outer shape of the cover member 30.

As shown in FIG. 2B, the cover member 30 has a shape in which a depression $30d$ is defined directly above the light source 20. The expression "directly above" refers to an area above the upper surface $21a$, from which light from the light-emitting element 21 is emitted. That is, at least a portion of the depression $30d$ is located above the upper surface $21a$. In the present embodiment, the cover member 30 has a dome shape, and the depression $30d$ is located at a part of the dome shape that is directly above the light source 20.

Figure 3A:
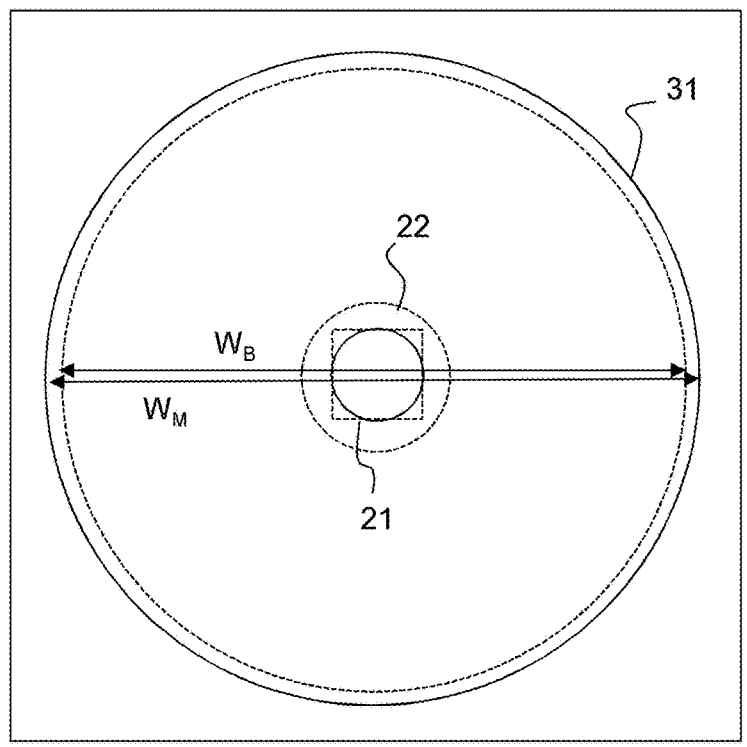
FIG. 3A is a schematic plan view showing, on an enlarged scale, a light source and its vicinity of a light-emitting device of another embodiment of the present disclosure.
Figure 3B:
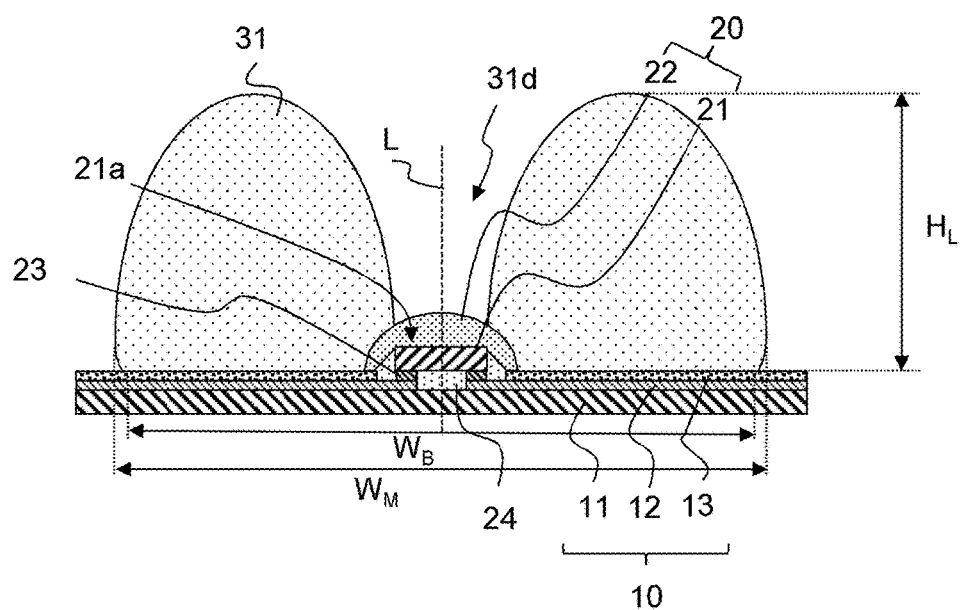
FIG. 3B is a cross-sectional view showing, on an enlarged scale, the light source and its vicinity of the light-emitting device of the another embodiment of the present disclosure.

Alternatively, the cover member 30 may have a shape in which a through hole is defined directly above the light source 20. FIG. 3A and FIG. 3B show an example of a cover member 31 having a through hole $31d$. The cover member 30 has a ring shape with the through hole $31d$.

A width $W_B$ of a bottom surface of the cover member 30 is less than the maximum width $W_M$ of the cover member 30. The cover member 30 has a height $H_L$ along an optical axis less than the maximum width $W_M$ of the cover member 30. In order to increase the uniformity of light emitted from the cover member 30 across a plane that is perpendicular to the optical axis L, the cover member 30 preferably has an outer shape that has rotational symmetry with respect to the optical axis L.

With the cover member 30 having such an outer shape, light emitted from the cover member 30 can have a bat-wing-type light distribution characteristic on a plane that contains the optical axis L. Thus, the amount of light emitted in a direction directly above the light source 20 can be reduced and the optical distribution of each light source 20 can be spread, so that unevenness in brightness can be improved.

Figure 4:
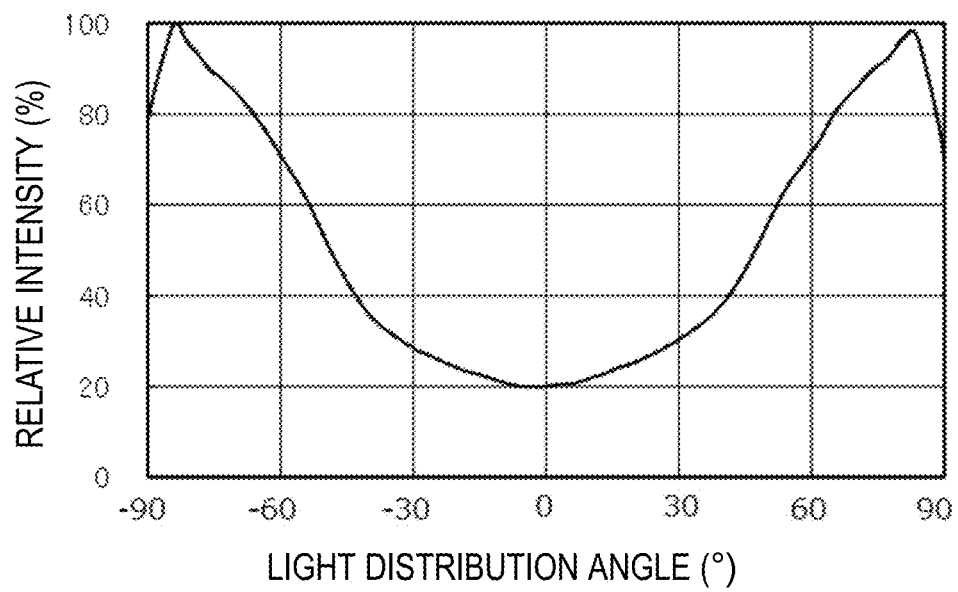
FIG. 4 is a graph showing an example of a light distribution characteristic of a cover member according to one embodiment.

In the present disclosure, the "bat-wing-type light distribution characteristic" refers to an emission intensity distribution in which the emission intensity is higher at light distribution angles whose absolute values are greater than an absolute value of 0°, where 0° is at the optical axis L. The "bat-wing-type light distribution characteristic" more specifically refers to an emission intensity distribution in which the emission intensity is highest around 45° to 90°. That is, the central portion of the bat-wing-type light distribution characteristic is darker than the peripheral portion. FIG. 4 shows an example of a bat-wing-type light distribution characteristic.

The cover member 30 can be formed by compression molding or injection molding to cover the light source 20, in a manner, for example, as described in Japanese Laid-Open Patent Publication No. 2016-171227, for example. Alternatively, the cover member 30 having a predetermined shape can be obtained by dropping or drawing the material of the cover member 30 having an optimized viscosity on the light source 20 with the use of the surface tension of the material.

Light-Transmissive Layered Structure 50

Light emitted from the cover member 30 covering the light source 20 passes through a light-transmissive layered structure 50. The light-transmissive layered structure 50 includes the first lenticular lens sheet 51, the second lenticular lens sheet 52, and the half mirror 53 disposed between the first lenticular lens sheet 51 and the second lenticular lens sheet 52. Passing of light emitted from the cover member 30 through the light-transmissive layered structure 50 allows for reducing unevenness in the brightness of light emitted from the cover member 30.

The first lenticular lens sheet 51 is arranged facing the base 10 via a plurality of light sources 20, and the half mirror 53 is disposed at an upper surface side of the first lenticular lens sheet. The second lenticular lens sheet is disposed at an upper surface side of the half mirror 53.

The interval OD between the first lenticular lens sheet 51 and the base 10 is preferably less than or equal to 0.25 times the pitch P between adjacent ones of the light sources 20. That is, it is preferable that OD≤0.25 P is satisfied. It is preferable that the interval OD is 0.18 times the pitch P or more and 0.25 times the pitch P or less. The pitch P is preferably 40 mm or less. With the arrangement of the first lenticular lens sheet 51, the second lenticular lens sheet 52, and the half mirror 53 as described above, it is possible to realize the effect of reducing unevenness in the brightness even if the interval OD between the first lenticular lens sheet 51 and the base 10 is reduced. With the interval OD in this range, it is possible to reduce the thickness of the light-emitting device while unevenness in the brightness.

First lenticular lens sheet 51 and second lenticular lens sheet 52

The first lenticular lens sheet 51 and the second lenticular lens sheet 52 are light-transmissive sheets each including an array of cylindrical lenses. The interval between grooves formed between cylindrical lenses, i.e., the width of each cylindrical lens, is for example in a range of 150 μm to 550 μm, preferably 200 μm to 450 μm, and more preferably 250 μm to 350 μm. Commercially-available lenticular lens sheets for optical components of backlights, lighting apparatuses, etc., can be used as the first lenticular lens sheet 51 and the second lenticular lens sheet 52. The first lenticular lens sheet 51 and the second lenticular lens sheet 52 are arranged such that the direction in which the grooves of the first lenticular lens sheet 51 extend intersects the direction in which the grooves of the second lenticular lens sheet 52 extend. It is preferable that the direction in which the grooves of the first lenticular lens sheet 51 extend and the direction in which the grooves of the second lenticular lens sheet 52 extend are at an angle of 85° or more and 95° or less.

Each of the first lenticular lens sheet 51 and the second lenticular lens sheet 52 is preferably arranged such that a surface thereof on which the grooves are not provided, i.e., a flat surface thereof, faces the base 10.

Half Mirror 53

The half mirror 53 reflects a portion of light incident on one of the principle surfaces thereof while allowing the remaining portion of the light pass therethrough. A reflectance of the half mirror 53 when light is incident perpendicularly thereon is preferably in range of 30% to 75% with respect to light in the emission wavelength band of the light source 20. If the reflectance of the half mirror 53 is lower than 30%, the amount of light reflected toward the first lenticular lens sheet 51 will be reduced, so that the effect of reducing unevenness in the brightness may be reduced. If the reflectance of the half mirror 53 is higher than 75%, the light extraction efficiency may be decreased.

Figure 5:
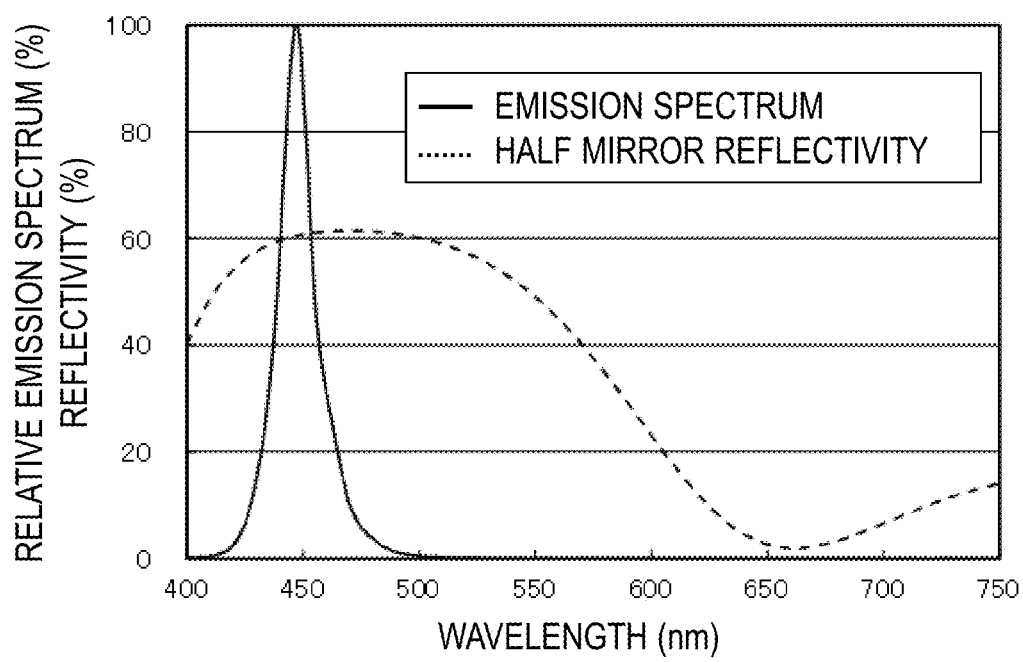
FIG. 5 is a graph showing an example of a relationship between the wavelength band of a half mirror and the emission wavelength of a light-emitting element according to one embodiment.

In the reflectance characteristics of the half mirror 53 in a direction perpendicular to the principle surface of the half mirror, it is preferable that a wavelength band at the longer wavelength side with respect to the peak emission wavelength of the light source 20 is wider than a wavelength band at the shorter wavelength side with respect to the peak emission wavelength. FIG. 5 shows an example of the emission spectrum of light emitted from the light source 20 and the reflectance characteristic of the half mirror 53. In FIG. 5, the horizontal axis indicates the wavelength, and the vertical axis indicates the reflectance and the relative emission intensity. The term "reflectance" as used herein refers to a value of reflectance with respect to the direction perpendicular to the principle surface of the half mirror 53. In the example shown in FIG. 5, the peak emission wavelength of the light source 20 is approximately 450 nm. For example, in reflectance characteristics of the half mirror 53, a wavelength band where the reflectivity is 40% or more at the shorter wavelength side with respect to 450 nm is a wavelength band of 50 nm between 400 nm and 450 nm, whereas another wavelength band at the longer wavelength side with respect to 450 nm is a wavelength band of 120 nm between 450 nm and 570 nm.

Generally, when light is incident on a half mirror at an oblique angle, an optical path length is increased, so that the reflection wavelength band of the half mirror shifts toward the shorter wavelength side as compared with when light is incident perpendicularly thereupon. For example, in the case in which a half mirror has a characteristic in which light of a certain wavelength λ incident perpendicularly upon the half mirror is reflected at a predetermined reflectance, the reflection wavelength band of light of a certain wavelength λ incident upon the half mirror at an oblique angle is shifted by δ toward the shorter wavelength side compared with the reflection wavelength band of light of the certain wavelength λ incident perpendicularly thereupon. Therefore, compared with a reflectance with respect to light of the wavelength λ incident perpendicularly, a reflectance with respect to light of the wavelength λ incident at an oblique angle is decreased, while a reflectance with respect to light of a wavelength shorter than the wavelength λ by an amount corresponding to the shift amount δ in the reflection wavelength band incident at an oblique angle is the same with the reflectance with respect to light of the wavelength λ incident perpendicularly.

In such a case, as described above, with design of the reflectance characteristic of the half mirror 53 in the direction perpendicular to the principal surface thereof in which the wavelength band at the longer wavelength side with respect to the peak emission wavelength of the light source 20 is wider than the wavelength band at the shorter wavelength side with respect to the peak emission wavelength, even if the reflection wavelength band shifts by δ toward the shorter wavelength side, it is possible to maintain the same reflectance due to the wide wavelength band at the longer wavelength side. For example, in such a range that the absolute value of the light distribution angle described above is approximately 40° or less, even if light is incident upon the half mirror 53 at an oblique angle, reduction in reflectance and increase in amount of light that is incident in a slightly oblique angle with respect to the optical axis L of the light source 20 passes through can be prevented, so that unevenness in brightness can be prevented from being noticeable.

The half mirror 53 preferably has a dielectric multi-layer film structure including a light-transmissive base member and an insulating films having a different refractive index layered thereon. The specific material of the insulating film is preferably a material having a low optical absorption with respect to a wavelength range of light radiated from the light source 20, such as a metal oxide film, a metal nitride film, a metal fluoride film or an organic material.

Using a dielectric multi-layer film allows for obtaining a reflective film having a low optical absorption. In addition, it is possible to approximately adjust the reflectance based on the design of the film, and it is possible to control the reflectance in accordance with the angle. In particular, with the reflectance with respect to light incident at an oblique angle lower than the reflectance with respect to light incident perpendicularly, it is possible to increase the reflectance with respect to light in the direction perpendicular to the light extraction surface (i.e., optical axis) and decrease the reflectance with respect to larger angles with respect to the optical axis.

Light-Diffusing Plate 54

The light-transmissive layered structure 50 may further include a light-diffusing plate 54. In such a case, the light-diffusing plate 54 is arranged on the upper surface of the second lenticular lens sheet 52. The light-diffusing plate 54 diffuses light incident thereupon while allowing the light to pass therethrough. For example, the light-diffusing plate 54 is formed from a material that has a low optical absorption with respect to visible light, such as polycarbonate resin, polystyrene resin, acrylic resin, polyethylene resin, etc. The light-diffusing plate 54 has a light-diffusing structure in which irregularities are provided on the surface of the light-diffusing plate 54 or a material having a different refractive index is dispersed in the light-diffusing plate 54. For the light-diffusing plate, a product that is commercially available on the market as a light-diffusing sheet, a diffuser film, or the like may be used.

Effect of Light-Emitting Device 100

With the light-emitting device 100, light emitted from the light source 20 passes through the light-transmissive layered structure 50, which includes the half mirror 53 arranged between the first lenticular lens sheet 51 and the second lenticular lens sheet 52, so that unevenness of the brightness can be reduced. In particular, using the cover member 30, which is a lens having a bat-wing-type light distribution characteristic, in combination with the light-transmissive layered structure 50, it is possible to realize a light-emitting device with which unevenness in the brightness is hardly noticeable, even if the interval OD between the first lenticular lens sheet 51 and the base 10 is less than or equal to 0.25 times the pitch P between light sources 20, for example. Therefore, with the light-emitting device 100 according to embodiments of the present disclosure, it is possible to realize a surface-emitting light-emitting device that is thin and that has a reduced unevenness in brightness.

As will be described in the following example, a position of the half mirror 53 with respect to the first lenticular lens sheet 51 and the second lenticular lens sheet 52 is particularly related to reduction in unevenness in the brightness. With the half mirror 53 arranged on the lower surface of the first lenticular lens sheet 51 or on the upper surface of the second lenticular lens sheet 52, the effect of reducing unevenness in brightness cannot sufficiently be realized.

It is known that lenticular lens sheets are used in backlight devices, and the like, in order to realize a light-condensing effect toward the emission direction. However, in such a case, two lenticular lens sheets are arranged under as equal optical conditions as possible in order to realize the light-condensing effect uniformly. Therefore, it is not typical to arrange a half mirror, which has a totally different function from lenticular lens sheets, between two lenticular lens sheets, as in the light-emitting device of the present disclosure, and such an arrangement may be typically considered to make unevenness in brightness rather more likely to occur. In view of this, the arrangement of two lenticular lens sheets and a half mirror in the light-emitting device of the present disclosure is not merely a choice of arrangement but is a novel structure based on knowledge of the present inventors.

Moreover, in the light-emitting device 100, the effect of improving unevenness in the brightness can be enhanced through an appropriate selection and arrangement of sheet-form optical members used in the light-transmissive layered structure 50, without substantial changes to the structure of the light sources 20 or the structure of the base 10 on which the light sources 20 are placed. Therefore, it is possible to realize the effect of improving unevenness in the brightness of a light-emitting device with the use of a relatively simple structure, i.e., with a low cost.

Example

1. Production of Samples

In order to confirm the effect of improving unevenness in brightness of the light-emitting device of the present disclosure, light-emitting devices having the structure shown in FIG. 1 were produced, and measurement results of unevenness in brightness will be described.

Light sources 20 and cover members 30 having the structure shown in FIG. 2A and FIG. 2B were provided, and a total of 24 of them were arranged on the base 10 in a two-dimensional array (6 in the x direction and 4 in the y direction) with a pitch of 32 mm.

Two lenticular lens sheets each having grooves with a pitch of 0.5 mm and a half mirror with a reflectance of 70% were provided, and a light-emitting device according to Example 1 of the present disclosure was produced with OD of 10 mm. The grooves of the first lenticular lens sheet 51 were parallel to the x direction, and the grooves of the second lenticular lens sheet 52 were parallel to the y direction.

For comparison, a light-emitting device according to Reference Example 1 was produced with the same structure as that of Example 1 except that the half mirror 53 was arranged on the upper surface of the second lenticular lens sheet 52, and another light-emitting device according to Reference Example 2 was produced with the same structure as that of Example 1 except that the half mirror 53 was arranged on the lower surface of the first lenticular lens sheet 51.

2. Measurement

Figure 6A:
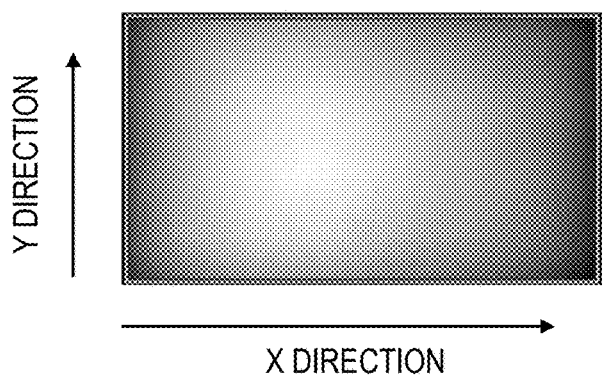
FIG. 6A shows a light-emitting surface of a light-emitting device according to Example.
Figure 7A:
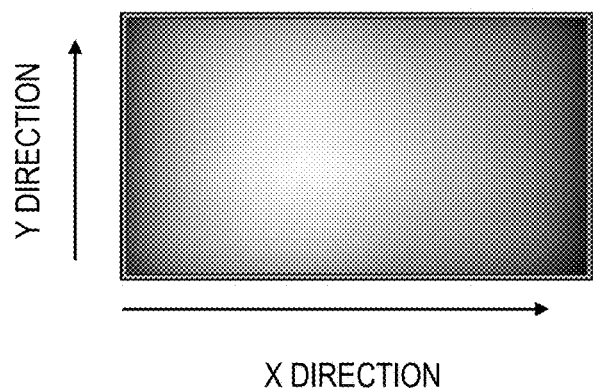
FIG. 7A shows a light-emitting surface of a light-emitting device according to Reference Example 1.
Figure 8A:
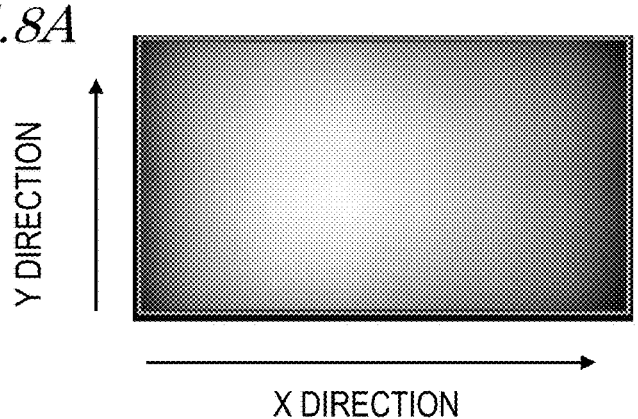
FIG. 8A shows a light-emitting surface of a light-emitting device according to Reference Example 2.

The light-emitting surfaces of the light-emitting devices according to Example 1, Reference Example 1 and Reference Example 2 were photographed under the same conditions. The results are shown in FIG. 6A, FIG. 7A and FIG. 8A, respectively.

Figure 6B:
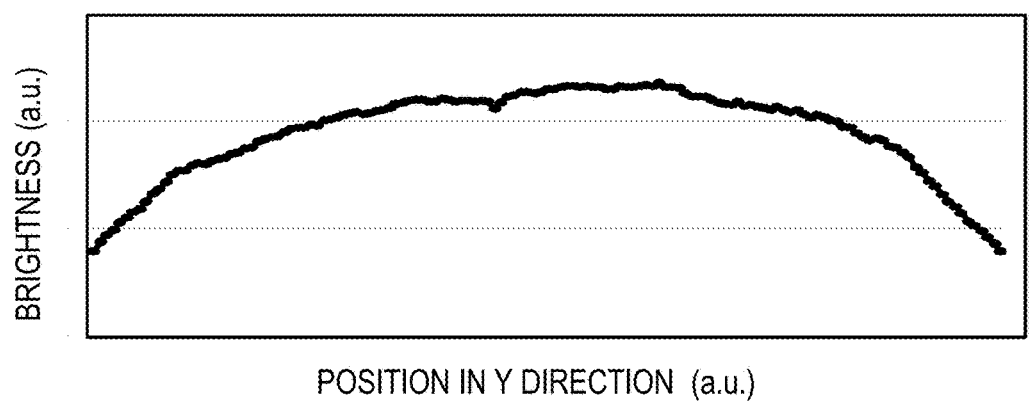
FIG. 6B shows a brightness profile in a y-direction of the light-emitting surface of the light-emitting device according to Example.
Figure 6C:
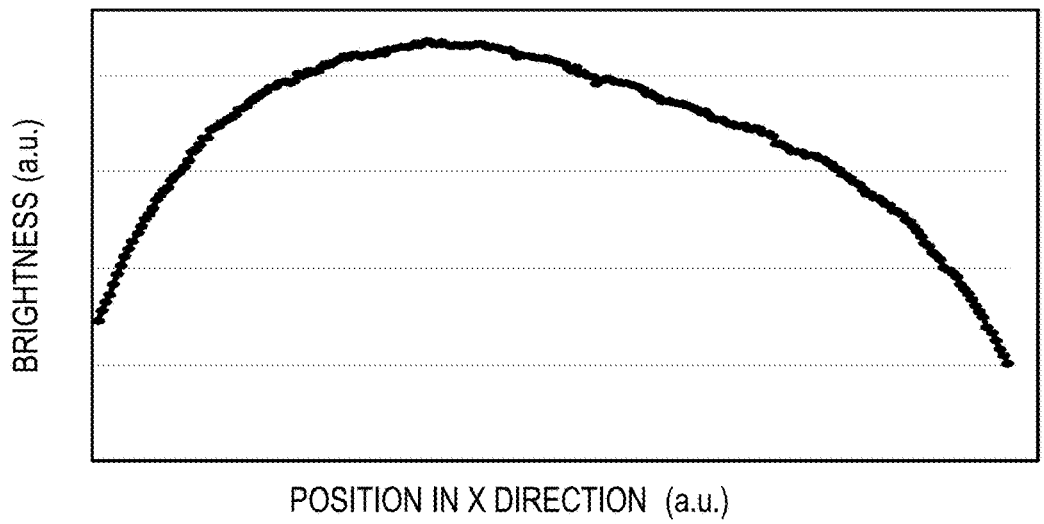
FIG. 6C shows a brightness profile in an x-direction of the light-emitting surface of the light-emitting device according to Example.
Figure 7B:
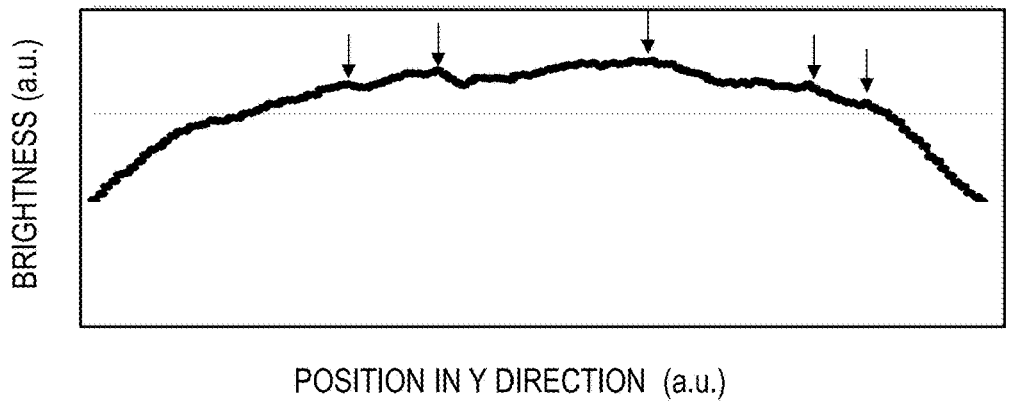
FIG. 7B shows brightness profile in a y-direction of the light-emitting surface of the light-emitting device according to Reference Example 1.
Figure 7C:
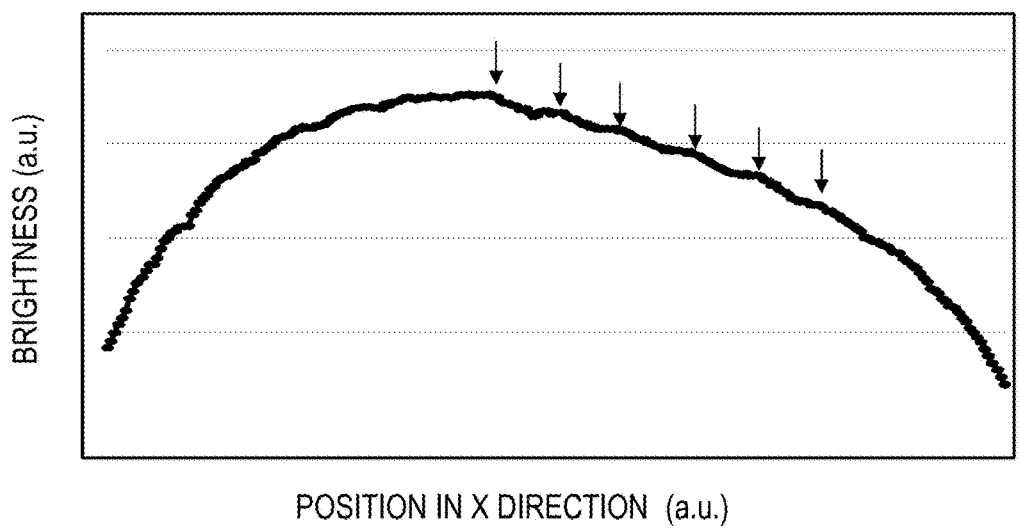
FIG. 7C shows brightness profile in an x-direction of the light-emitting surface of the light-emitting device according to Reference Example 1.
Figure 8B:
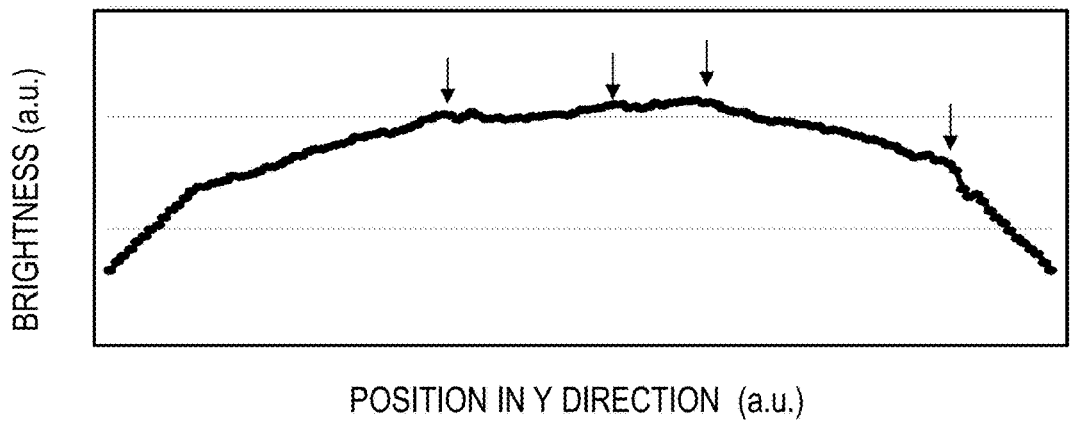
FIG. 8B shows brightness profile in a y-direction of the light-emitting surface of the light-emitting device according to Reference Example 2.
Figure 8C:
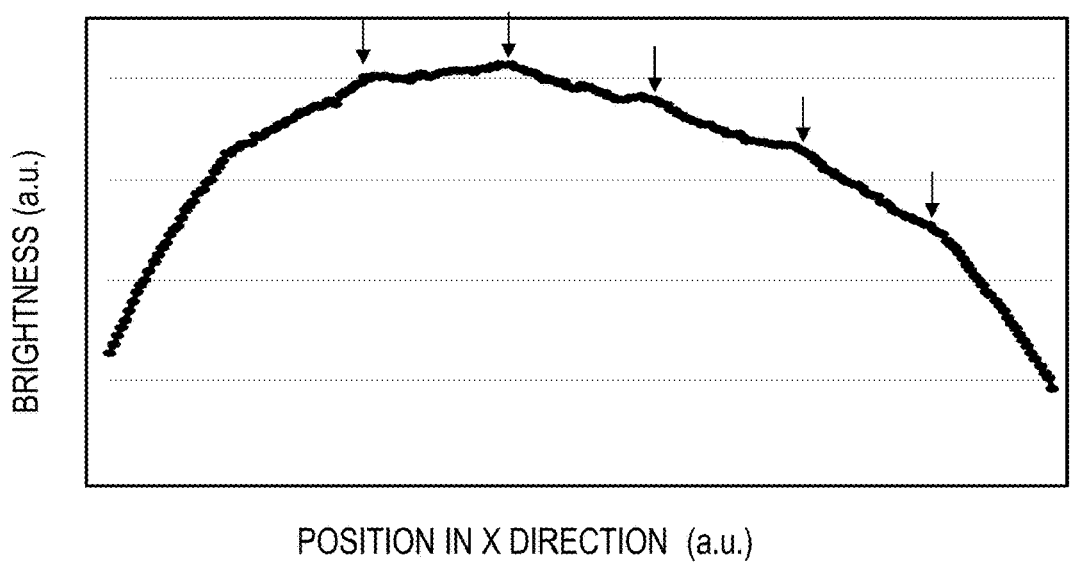
FIG. 8C shows brightness profile in an x-direction of the light-emitting surface of the light-emitting device according to Reference Example 2.

The brightness profile in the x-direction and the brightness profile in the y-direction at a predetermined point on the light-emitting surface were measured. Also, the brightness at the predetermined point was measured. The brightness is shown in Table 1. The y-direction brightness profiles of the light-emitting devices of Example 1, Reference Example 1 and Reference Example 2 are shown in FIG. 6B, FIG. 7B and FIG. 8B, respectively. The horizontal axis indicates the y-direction position on the light-emitting surface, and the vertical axis indicates the relative brightness. The x-direction brightness profiles of the light-emitting devices of Example 1, Reference Example 1 and Reference Example 2 are shown in FIG. 6C, FIG. 7C and FIG. 8C, respectively. The horizontal axis indicates the x-direction on the light-emitting surface, and the vertical axis indicates the relative brightness.

3. Results and Discussion

TABLE 1

| Samples | Brightness (a.u.) |
| --- | --- |
| Example 1 | 4113 |
| Reference Example 1 | 3684 |
| Reference Example 2 | 4011 |

As shown in Table 1, the brightness of Example 1 was the highest, and the brightnesses of Reference Examples 1 and 2 were lower than that of Example 1. Reference Example 1 had a particularly low brightness. This is considered to be because the light-emitting device of Reference Example 1 has the half mirror 53 furthest on the light output side, and the final light extraction efficiency is limited by the reflectivity of the half mirror.

A comparison between FIG. 6A, FIG. 7A, and FIG. 8A shows that unevenness in brightness is hardly noticeable in Example 1, whereas Reference Example 1 and Reference Example 2 each exhibit a dot-shaped unevenness in brightness in which the brightness at the positions of the light sources 20 is higher than that at its surroundings. This appears in the brightness profiles in the y-direction and the brightness profiles in the x-direction shown in FIG. 6B, FIG. 6C, FIG. 7B, FIG. 7C, FIG. 8B and FIG. 8C. As shown in FIG. 6B and FIG. 6C, brightness profiles in the x-direction and y-direction of Example 1 are smooth curves with substantially no irregularities at the position corresponding to the light source. In contrast, as shown in FIG. 7B, FIG. 7C, FIG. 8B and FIG. 8C, the brightness profiles in the x-direction and the y-direction of Reference Example 1 and Reference Example 2 each includes protruding portions at positions indicated by arrows, indicating that the brightness at positions corresponding to the light source is higher than its surrounding positions.

As described above, it can be seen that unevenness in brightness differs significantly according to the position of the half mirror, and that unevenness in brightness is suppressed with the light-emitting device of Example 1.

The light-emitting device of the present disclosure can suitably be used for light sources of backlight devices for liquid crystal display devices, various lighting apparatuses, etc.

While exemplary embodiments of the present invention have been described, it will be apparent to those skilled in the art that the disclosed embodiments may be modified in numerous ways and may assume many configurations other than those specifically described above. Accordingly, it is intended by the appended claims to cover all modifications of the invention that fall within the true spirit and scope of the invention.

What is claimed is:

1. A light-emitting device comprising:
   a base having an upper surface;
   a plurality of light sources located on the upper surface of the base;
   a first lenticular lens sheet disposed to face the base with the light sources between the first lenticular lens sheet and the base, the first lenticular lens sheet including a first plurality of grooves;

a half mirror located on an upper surface side of the first lenticular lens sheet; and a second lenticular lens sheet disposed on an upper surface side of the half mirror, wherein the second lenticular lens sheet includes a second plurality of grooves extending in a direction that intersects a direction in which the first plurality of grooves of the first lenticular lens sheet extend.

2. The light-emitting device of claim 1, wherein the direction in which the first plurality of grooves of the first lenticular lens sheet extend and the direction in which the second plurality of grooves of the second lenticular lens sheet extend are at an angle of 85° or more and 95° or less.

3. The light-emitting device of claim 1, wherein the upper surface of the base is light-reflective.

4. The light-emitting device of claim 1, further comprising a light-diffusing plate disposed at an upper surface side of the second lenticular lens sheet.

5. The light-emitting device of claim 1, wherein the half mirror includes a dielectric multi-layer film.

6. The light-emitting device of claim 1, wherein a reflectance characteristic of the half mirror in a direction perpendicular to a main surface of the half mirror is such that a wavelength band at a longer wavelength side with respect to a peak emission wavelength of the light source is wider than a wavelength band at a shorter wavelength side with respect to the peak emission wavelength of the light source.

7. The light-emitting device of claim 1, further comprising:

a plurality of cover members each covering a corresponding one of the light sources;

wherein the cover member has a depression or a through hole directly above the light source; and wherein a bottom surface width of the cover member is less than a maximum width of the cover member.

8. The light-emitting device of claim 7, wherein a height of the cover member along an optical axis of light emitted from the light source is less than the maximum width of the covering member.

9. The light-emitting device of claim 1, wherein:

each of the light sources comprises:

at least one light-emitting element, and a wavelength conversion member covering the at least one light-emitting element.

10. The light-emitting device of claim 1, wherein an interval between the first lenticular lens sheet and the base is less than or equal to 0.25 times a pitch between adjacent ones of the light sources.

* * * * *